US009476952B2

(12) United States Patent
Seo et al.

(10) Patent No.: US 9,476,952 B2
(45) Date of Patent: Oct. 25, 2016

(54) STRUCTURE OF MEASURING IRON LOSS OF MOTOR STATOR CORE

(71) Applicants: Hyundai Motor Company, Seoul (KR); Kia Motors Corporation, Seoul (KR); Chungbuk National University Industry-Academic Cooperation Foundation, Cheongju-si, Chungcheongbuk-do (KR)

(72) Inventors: Young Jin Seo, Yongin-si (KR); Myeong Kyu Jung, Seoul (KR); Dongyeon Han, Seoul (KR); Shin Gyu Kim, Incheon (KR); Chang-Seop Koh, Cheongju-si (KR); Kwang-Young Jeong, Cheongju-si (KR); Chan-Hyuk Park, Cheongju-si (KR); Hee-Sung Yoon, Cheongju-si (KR)

(73) Assignees: HYUNDAI MOTOR COMPANY, Seoul (KR); KIA MOTORS CORPORATION, Seoul (KR); Chungbuk National University Industry-Academic Cooperation Foundation, Cheongju-Si, Chungcheongbuk-Do (KR)

( * ) Notice: Subject to any disclaimer, the term of this patent is extended or adjusted under 35 U.S.C. 154(b) by 148 days.

(21) Appl. No.: 14/338,204

(22) Filed: Jul. 22, 2014

(65) Prior Publication Data
US 2015/0077099 A1 Mar. 19, 2015

(30) Foreign Application Priority Data
Sep. 16, 2013 (KR) .................. 10-2013-0111206

(51) Int. Cl.
*G01R 33/14* (2006.01)
*G01R 33/12* (2006.01)
*G01R 31/34* (2006.01)

(52) U.S. Cl.
CPC .............. *G01R 33/123* (2013.01); *G01R 31/34* (2013.01); *H02K 11/20* (2016.01)

(58) Field of Classification Search
CPC .. G01R 33/123; G01R 31/34; G01R 15/183; G01R 15/185; G01R 15/186; H02K 11/20; H02K 11/225; G01N 27/72; G01N 27/82; G01N 27/83; G01N 27/84; G01N 27/85; G01N 27/90

USPC .......... 324/222, 223, 224, 228–243, 765.01, 324/207.25, 227; 702/38, 182, 183
See application file for complete search history.

(56) References Cited

U.S. PATENT DOCUMENTS 5,341,095 A * 8/1994 Shelton .................. G01R 31/34
324/545

(Continued)

FOREIGN PATENT DOCUMENTS

| JP | 2012-065493 A | 3/2012 |
| JP | 2012-223052 A | 11/2012 |
| KR | 10-2010-0068871 A | 6/2010 |

OTHER PUBLICATIONS

Kwang-Young Jeong, et al., "The measurement of effect of leakage flux at difference place of wound search coil for iron loss of stator core using inner core method", The Korean Institute of Electrical Engineers, 2013.4, pp. 51-53 with English language Abstract.

*Primary Examiner* — Arleen M Vazquez
*Assistant Examiner* — Steven Yeninas
(74) *Attorney, Agent, or Firm* — McDermott Will & Emery LLP

(57) ABSTRACT

A structure for measuring iron loss of a motor stator core is provided. The structure includes an auxiliary core whose both end surfaces in a longitudinal direction come in contact with inner end surfaces of two adjacent stator teeth among a plurality of stator teeth in a radial direction in order to measure iron loss of a stator core in which a plurality of slots and the plurality of stator teeth are alternately formed on an inner circumferential surface of a stator yoke in a circumferential direction. A pair of excitation windings is provided at portions of the auxiliary core in the longitudinal direction spaced-apart from each other. A B-coil that is a sensor coil is provided at the auxiliary core so as to be positioned inside any one excitation winding of the pair of excitation windings. Fixing protrusions protrude from the both end surfaces of the auxiliary core to extend in the longitudinal direction, and inserted into the slot between the two adjacent stator teeth to be fitted and fixed in the circumferential direction. Accordingly, it is possible to quantitatively and accurately measure iron loss of the motor stator core for each manufacturing process.

10 Claims, 10 Drawing Sheets

(56) References Cited

U.S. PATENT DOCUMENTS 6,469,504 B1 * 10/2002 Kliman .............. G01N 27/9006
        324/228
6,489,781 B1 * 12/2002 Kliman .................. G01R 31/34
        324/529
6,794,884 B2 * 9/2004 Kliman ..................... G01L 1/12
        324/228

* cited by examiner

STRUCTURE OF MEASURING IRON LOSS OF MOTOR STATOR CORE

CROSS-REFERENCE TO RELATED APPLICATION

This application claims priority to and the benefit of Korean Patent Application No. 10-2013-0111206 filed in the Korean Intellectual Property Office on Sep. 16, 2013, the entire contents of which are incorporated herein by reference.

FIELD OF THE INVENTION

The present invention relates to a structure for measuring iron loss of a motor stator core, and more particularly, to a structure for measuring manufacturing iron loss of a motor stator core, capable of accurately measuring iron loss for each step of manufacturing and assembling processes of a motor stator core by using a C-shaped auxiliary core.

BACKGROUND

In general, an electric motor is called a motor, and is a device that converts electrical energy into mechanical energy by using power received by a conductor in which current flows in a magnetic field. The electric motor typically includes a cylindrical stator that is fixed into a frame and around which a coil is wound, and a rotor that is disposed inside or outside the stator and transfers a power while being rotated by induced magnetism formed near the coil.

The electric motor may be classified as a DC electric motor, an induction electric motor, a synchronous electric motor, and an AC commutator electric motor according to rotation principles.

Loss is necessarily generated due to a structural matter when the electric motor is driven. Copper loss and iron loss are the main losses generated in the induction electric motor and a permanent magnet synchronous electric motor.

In order to increase driving efficiency of the electric motor, the copper loss and the iron loss need to be appropriately reduced. Since the iron loss of the electric motor is usually generated in a stator core, rather than a rotor core, it is most important to measure and reduce the iron loss of the stator core to thereby increase efficiency of the electric motor.

The iron loss generated in the motor stator core is characterized by a waveform of applied magnetic flux density and an intrinsic loss characteristic of an electric steel sheet (e.g., a silicon steel sheet) used to manufacture the stator core.

The motor stator core is generally manufactured through a punching process, a laminating process, a winding process, a varnishing process, and a housing inserting process. Since mechanical stress is applied to the motor stator core in a series of manufacturing processes, the intrinsic loss characteristic of the electric steel sheet, which is a material of the motor stator core, is changed after the manufacturing processes, and the iron loss is generally increased for the same magnetic flux density waveform.

FIG. 1 illustrates a change in iron loss for each of the various processes of manufacturing a motor stator core. The sample is an isotropic electrical steel sheet, and a measurement frequency is 200 Hz. The iron loss of the motor stator core is gradually increased for each of the manufacturing processes.

Accordingly, in order to reduce the iron loss generated in the motor stator core, each manufacturing process needs to be managed so as not to excessively increase iron loss by quantitatively measuring the iron loss generated for each of processes of manufacturing the motor stator core.

In order to measure the iron loss of the motor stator core for each of the manufacturing processes described above, there is disclosed a measuring method using a C-shaped auxiliary core in the related art.

As illustrated in FIG. 2, the motor stator core used for measuring the iron loss has a structure in which a stator yoke 10 and stator teeth 20 are formed as one iron core. A plurality of stator teeth 20 is formed on an inner circumferential surface of the stator yoke 10 spaced-apart in a circumferential direction, and slots 30 are formed between the stator teeth 20. A coil is inserted into the slots 30 to be wound around the stator teeth 20.

One or more fixing grooves 40 that are concave inward in a radial direction are formed on an outer circumferential surface of the motor stator core spaced-apart in the circumferential direction. The fixing grooves 40 serve to fix the stator core to an inner wall of a housing when the stator core is inserted and provided into the housing.

A C-shaped auxiliary core 50 is provided in an inner space of the stator core used for measuring the iron loss of the stator core. The C-shaped auxiliary core 50 is provided to come in contact with two stator teeth 20, which are spaced-apart from each other in the circumferential direction, among the plurality of stator teeth 20. The C-shaped auxiliary core 50 is provided such that two ends thereof come in contact with inner ends of the two stator teeth 20, which are spaced-apart from each other in the circumferential direction, in the radial direction. Two excitation windings 52 are wound around certain portions of the C-shaped auxiliary core 50 in a longitudinal direction, and the two excitation windings 52 are disposed to be spaced-apart from each other in the longitudinal direction of the C-shaped auxiliary core 50.

Further, a B-coil 54 is wound around a portion positioned inside any one excitation winding 52 of the two excitation windings 52 at a certain portion of the C-shaped auxiliary core 50 in the longitudinal direction. The B-coil 54 is a sensor coil used to measure an induced voltage.

After the C-shaped auxiliary core 50 is provided at the stator core, magnetic flux density, magnetic field intensity, and iron loss of the stator core are calculated using the C-shaped auxiliary core 50 from the following equation.

Magnetic flux density $H(t)=N*i(t)/L$ (where N is the number of excitation windings, i(t) is the excitation current, and L is the useful magnetic flux path);

Magnetic field intensity $$B(t) = -\frac{1}{NA} \times \int e(t)dt$$

(where N is the number of winding of sensor coil, A is the cross-section area of C-shaped auxiliary core, and e(t) is the induced voltage); and Iron loss $$P = \frac{1}{T}\int H(t)\frac{dB(t)}{dt}dt$$

(where T is the cycle).

That is, the magnetic flux density is calculated using excitation current, the magnetic field intensity is calculated by measuring a voltage generated in the sensor coil (B-coil) of the C-shaped auxiliary core, and the iron loss is calculated by subtracting copper loss of the excitation winding from an input power.

As illustrated in FIG. 3, the method for measuring the iron loss of the motor stator core using the C-shaped auxiliary core of the related art can quantitatively measure a change in iron loss generated after a punching process of the stator core, a laminating process, a winding process 60, a varnishing process, and an inserting process of housing 70.

However, in the method for measuring the iron loss of the motor stator core using the C-shaped auxiliary core of the related art, in order to improve measurement accuracy, end surfaces of the C-shaped auxiliary core 50 need to come in close contact with inner end surfaces of the stator teeth 20 in the radial direction, as illustrated in FIG. 4.

When the end surfaces of the C-shaped auxiliary core 50 do not come in close contact with the inner end surfaces of the stator teeth 20 in the radial direction, such as when a gap is generated therebetween, vibration caused by electromagnetic force between two cores reduces the measurement accuracy.

However, due to tolerance when the motor stator core is manufactured, or an angle error generated when the C-shaped auxiliary core is inserted and attached to the housing 70, the end surfaces of the C-shaped auxiliary core and the end surfaces of the stator teeth 20 may not completely come in contact with each other, as illustrated in FIG. 5.

When iron loss is measured in a state where the end surfaces of the C-shaped auxiliary core and the end surfaces of the stator teeth 20 do not completely come in contact with each other, electromagnetic force may be alternately generated between the stator teeth 20 and the C-shaped auxiliary core 50 to cause vibration in the C-shaped auxiliary core 50, and the end surfaces of the stator teeth 20 and the end surfaces of the C-shaped auxiliary core 50 may be misaligned due to the vibration. As a result, the C-shaped auxiliary core 50 is rotated by a predetermined angle in the circumferential direction as illustrated in FIG. 6, and, thus, the end surfaces of the C-shaped auxiliary core 50 may be slung between the two stator teeth 20.

Further, a gap may be formed between two cores due to the vibration in the C-shaped auxiliary core 50, and an error may be caused in measuring magnetic field intensity due to additional magnetomotive force consumed in the gap. In addition, a size of a cross-section in which magnetic flux flows is changed due to the rotation of the C-shaped auxiliary core 50, and, thus, the measurement accuracy may be degraded.

The above information disclosed in this Background section is only for enhancement of understanding of the background of the invention and therefore it may contain information that does not form the prior art that is already known in this country to a person of ordinary skill in the art.

SUMMARY

The present disclosure has been made in an effort to provide a structure for measuring iron loss of a motor stator core having advantages of quantitatively and precisely measuring iron loss for each process of manufacturing the motor stator core by accurately bringing end surfaces of a C-shaped auxiliary core into contact with end surfaces of a stator core.

An exemplary embodiment of the present disclosure provides a structure for measuring manufacturing iron loss of a motor stator core. The structure includes an auxiliary core whose both end surfaces in a longitudinal direction come in contact with inner end surfaces of two adjacent stator teeth among a plurality of stator teeth in a radial direction in order to measure iron loss of a stator core in which a plurality of slots and the plurality of stator teeth are alternately formed on an inner circumferential surface of a stator yoke in a circumferential direction. A pair of excitation windings is provided at portions of the auxiliary core in the longitudinal direction spaced-apart from each other. A B-coil that is a sensor coil is provided at the auxiliary core so as to be positioned inside any one excitation winding of the pair of excitation windings. Fixing protrusions are formed protruding from the both end surfaces of the auxiliary core to extend in the longitudinal direction, and are inserted into the slot between the two adjacent stator teeth to be fitted and fixed in the circumferential direction.

A width of the stator yoke may be equal to the entire width of the adjacent stator teeth.

The auxiliary core may have a uniform width in the longitudinal direction.

A width of the auxiliary core may be equal to or smaller than the entire width of the two adjacent stator teeth.

A width of the auxiliary core may be equal to or greater than the entire width of the two adjacent stator teeth.

An inner end of the stator tooth in the radial direction may be provided with projections at both edges in a width direction to extend in the width direction.

One projection of the stator tooth may protrude toward one projection of another stator tooth adjacent thereto.

A width of the fixing protrusion may be equal to a width between adjacent projections.

The fixing protrusion may have a square shape.

The auxiliary core may have a "C" shape.

According to an embodiment of the present disclosure, in the structure of measuring iron loss of a motor stator core, when the fixing protrusions are formed on the both end surfaces of the C-shaped auxiliary core in the longitudinal direction protruding in the longitudinal direction and the fixing protrusions are respectively inserted through the slots formed between the stator teeth of the stator core at the time of assembling the C-shaped auxiliary core with the stator core, the fixing protrusions are fit between the stator teeth to be fixed in the circumferential direction.

Accordingly, the C-shaped auxiliary core can be stably assembled with the stator teeth of the stator core, and it is possible to improve measurement accuracy by closely bringing the end surfaces of the C-shaped auxiliary core into contact with the end surface of the stator teeth when the C-shaped auxiliary core and the stator core are assembled.

Further, rotation of the C-shaped auxiliary core in the circumferential direction is prevented by interaction between the fixing protrusions and the stator teeth when the C-shaped auxiliary core and the stator core are assembled. When the iron loss of the stator core is measured, even though an external force, such as vibration, is applied to the auxiliary core, because the C-shaped auxiliary core stably comes in contact with the stator teeth, it is possible to quantitatively and accurately measure iron loss of the stator core for each of the manufacturing processes. As a result, it is possible to easily manage the stator core.

Moreover, it is possible to manage and appropriately reduce the iron loss of the stator core for each of the manufacturing processes, and it is possible to improve efficiency of the motor.

DETAILED DESCRIPTION

The present invention will be described more fully hereinafter with reference to the accompanying drawings such that those skilled in the art would realize exemplary embodiments of the invention.

Figure 1:
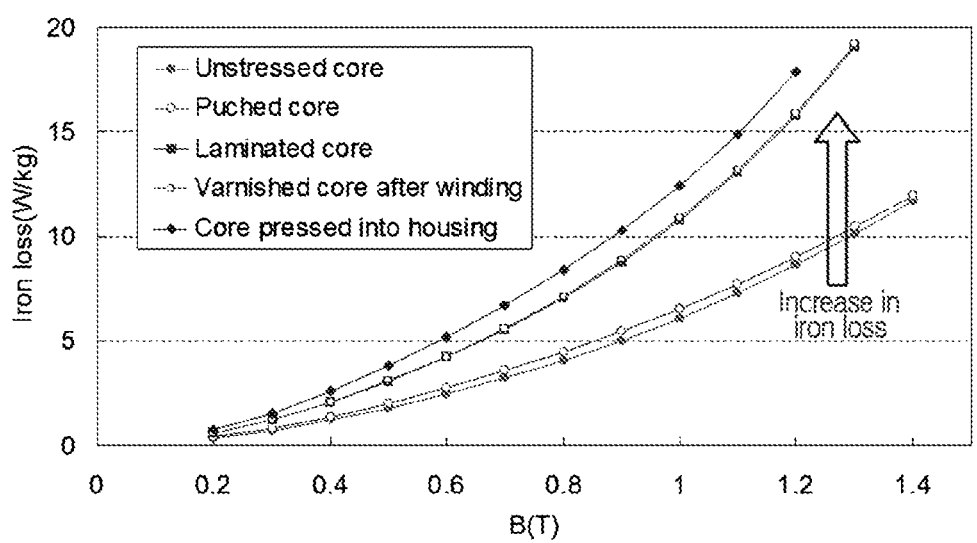
FIG. 1 is a graph illustrating a change in iron loss of a motor stator core for each manufacturing process.
Figure 2:
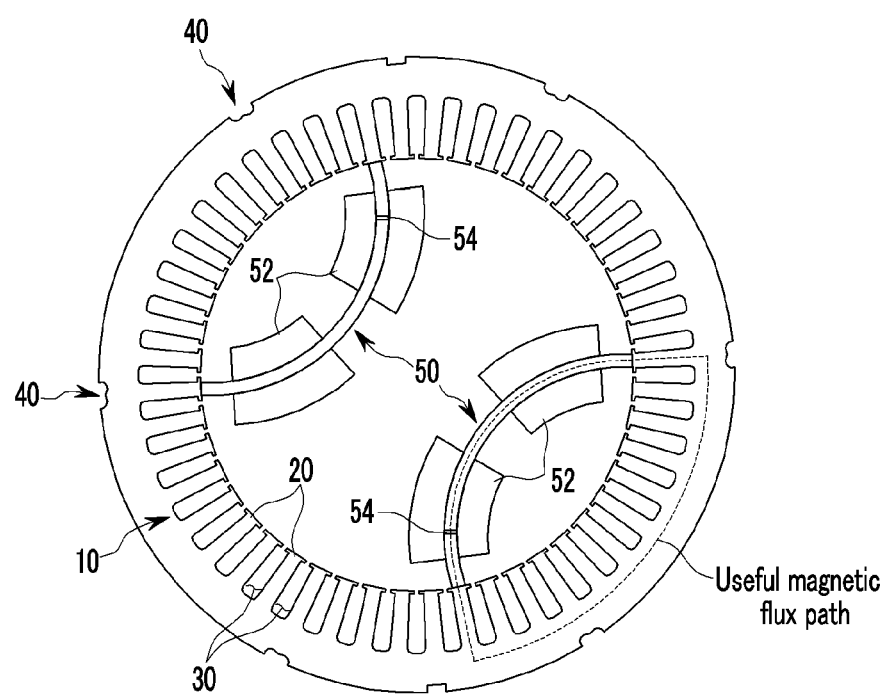
FIG. 2 is a plan view illustrating a state where a motor stator core and a C-shaped auxiliary core according to the related art are assembled.
Figure 3:
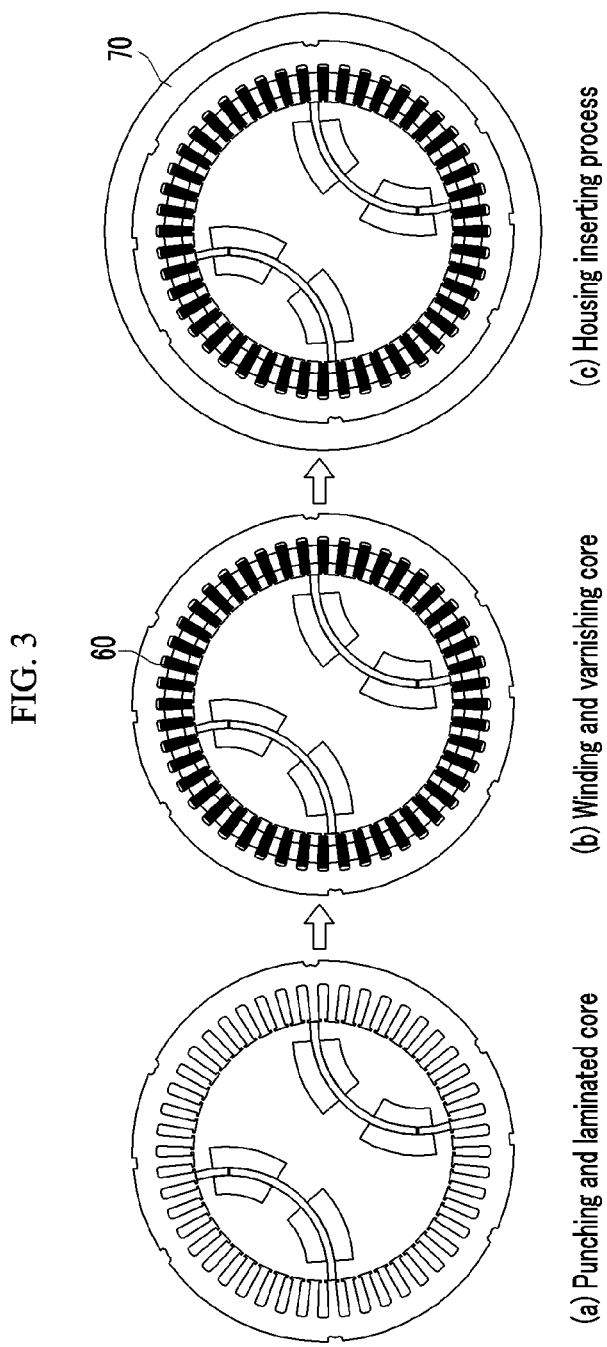
FIG. 3 is an explanatory diagram for describing processes of manufacturing the stator core according to the related art.
Figure 4:
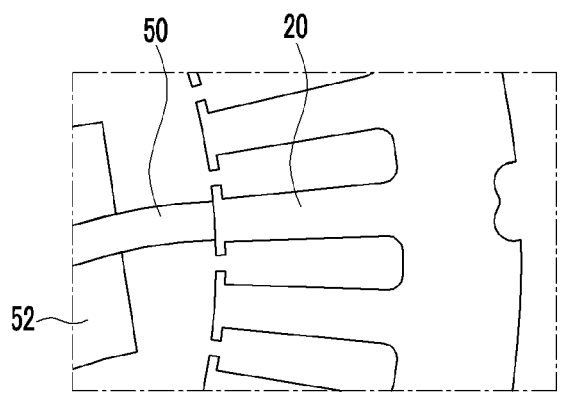
FIG. 4 is an enlarged view of major parts of FIG. 2.
Figure 5:
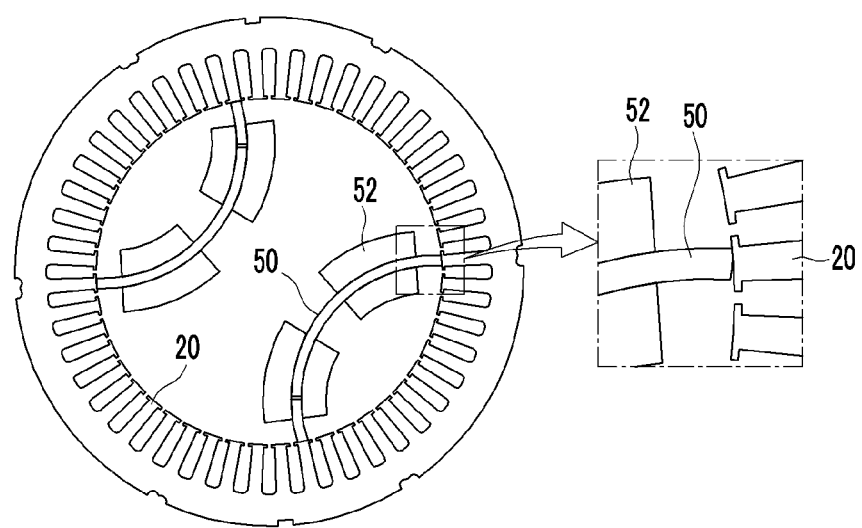
FIG. 5 illustrates a plan view and an enlarged view illustrating a state where the C-shaped auxiliary core badly comes in contact with end surfaces of stator teeth of the motor stator core.
Figure 6:
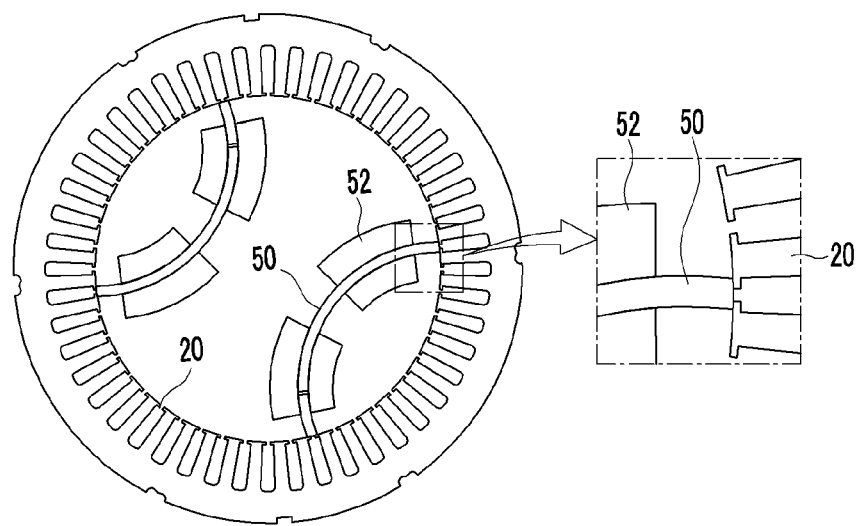
FIG. 6 illustrates a plan view and an enlarged view illustrating a state where the C-shaped auxiliary core is rotated by vibration when the motor stator core and the C-shaped auxiliary core according to the related art are assembled.
Figure 7:
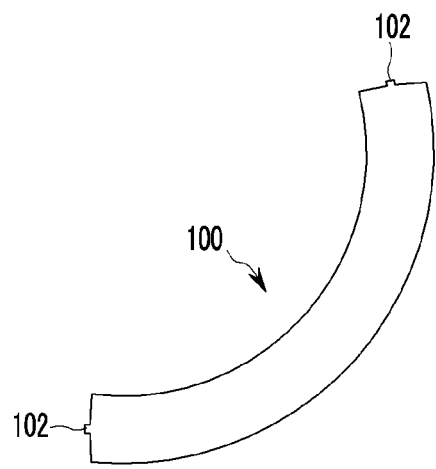
FIG. 7 is a plan view of a C-shaped auxiliary core according to an exemplary embodiment of the present disclosure.

Referring to FIG. 7, a structure for measuring iron loss of a motor stator core according to an exemplary embodiment of the present disclosure may include a C-shaped auxiliary core 100 having a substantially alphabetical character "C" shape. The C-shaped auxiliary core 100 may have a substantially uniform width in a longitudinal direction. Fixing protrusions 102 may protrude from both end surfaces of the C-shaped auxiliary core 100 in the longitudinal direction to extend in the longitudinal direction. The fixing protrusions 102 may protrude from centers of the both end surfaces of the C-shaped auxiliary core 100 in a width direction. The fixing protrusions 102 have square shapes, but may have other shapes as long as they are inserted and fixed to slots between stator teeth to be described below.

Figure 8:
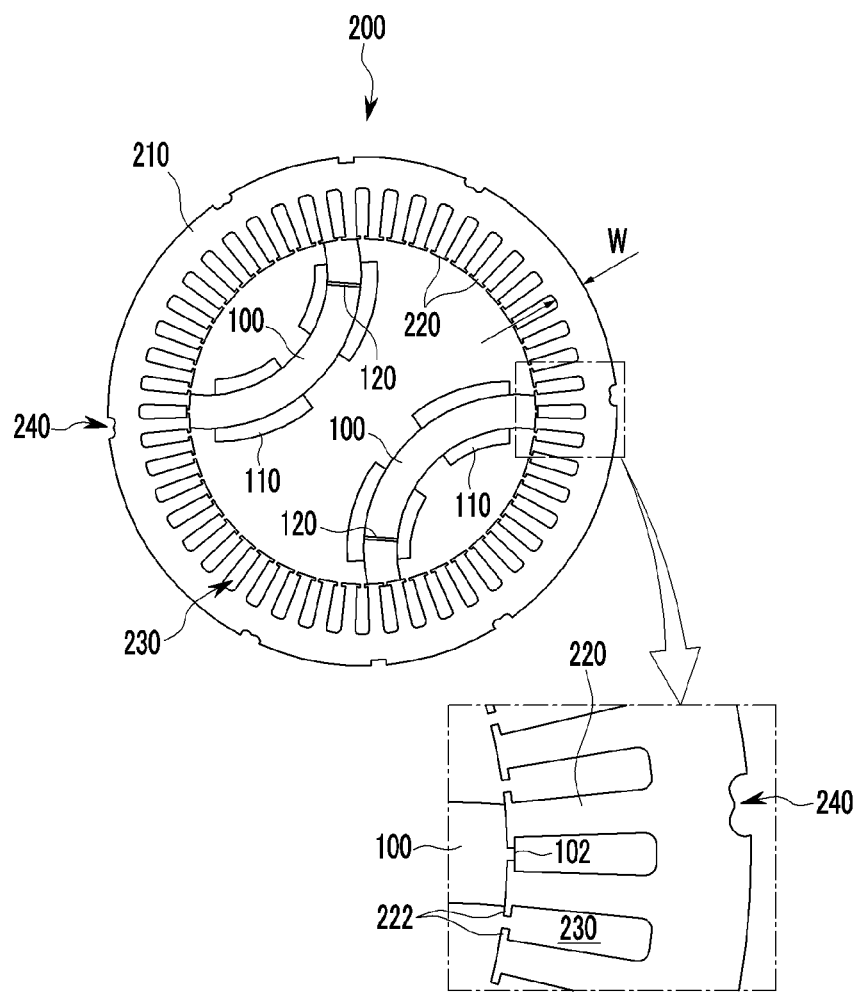
FIG. 8 is a plan view illustrating a state where a laminated stator core and the C-shaped auxiliary core according to an exemplary embodiment of the present disclosure are assembled.

Referring to FIG. 8, a motor stator core 200 may have a structure in which a stator yoke 210 and stator teeth 220 are formed as one iron core.

A plurality of stator teeth 220 may be formed spaced-apart from each other on inner circumferential surface of the stator yoke 210 in a circumferential direction, and slots 230 may be formed between the stator teeth 220. A coil may be inserted into the slots 230 to be wound about the stator teeth 220.

One or more fixing grooves 240 that are concave inward in a radial direction may be formed on an outer circumferential surface of the motor stator core 200 separated by a distance in the circumferential direction. The fixing grooves 240 serve to fix the stator core 200 to an inner wall of a housing to be described below when the stator core 200 is inserted to be attached to the housing.

The C-shaped auxiliary core 100 may be provided in an inner space of the stator core 200 to measure iron loss of the stator core 200. The C-shaped auxiliary core 100 may come in contact with two stator teeth 220, which are spaced-apart from each other by a distance in the circumferential direction, among the plurality of stator teeth 220.

That is, two end surfaces of the C-shaped auxiliary core 100 may be spaced-apart from each other in the circumferential direction, and may be provided to respectively come in contact with inner end surfaces of a pair of adjacent stator teeth 220 in the radial direction.

A pair of excitation windings 110 is wound around portions of the C-shaped auxiliary core 100 in the longitudinal direction, and the pair of excitation windings 110 is disposed to be spaced apart from each other in the longitudinal direction of the C-shaped auxiliary core 100.

Further, a B-coil 120 may be wound around a portion positioned inside any one excitation winding 110 of the two excitation windings 110, which is a certain portion of the C-shaped auxiliary core 100 in the longitudinal direction. The B-coil 120 may be a sensor coil used to measure an induced voltage.

When the C-shaped auxiliary core 100 is inserted in the inner space of the motor stator core 200 to come in contact with the end surfaces of the stator teeth 220, after the fixing protrusions 102 are inserted through the slots 230, the fixing protrusions are fixed so as not to be rotated in the circumferential direction by being fitted between ends of the pair of adjacent stator teeth 220.

Projections 222 extending in a width direction may be formed at both edges of the end of the stator tooth 220 in the width direction. The projection 222 of one stator tooth 220 may be formed to protrude toward the projection 222 of another stator tooth 220 adjacent thereto.

The fixing protrusion 102 of the C-shaped auxiliary core 100 may be inserted through the slot 230 between the projections 222 of the pair of stator teeth 220, and may be fitted between two adjacent projections 222 to be fixed in the circumferential direction.

In the exemplary embodiment of the present disclosure, the C-shaped auxiliary core 100 may be designed as follows.

The stator teeth 220 may be selected such that a width W of the stator yoke 210 and the entire width of the stator teeth 220 are substantially equal so as to generate uniform magnetic flux density in the stator yoke 210 and the stator teeth 220 of the stator core 200, and two stator teeth 220 may be selected in the exemplary embodiment of the present disclosure.

A width of the C-shaped auxiliary core 100 is may be designed such that the width of the C-shaped auxiliary core 100 is not greater than the entire width of the selected stator teeth 220 so as to generate uniform magnetic flux density in the stator teeth 220 and the C-shaped auxiliary core 100.

Further, the width of the C-shaped auxiliary core 100 may be equal to or greater than the entire width of the selected stator teeth.

In addition, the fixing protrusion 102 of the C-shaped auxiliary core 100 may be designed such that a width of the fixing protrusion is the same as a width of the slot 230 between the projections 222 of the pair of selected stator teeth 220.

Figure 9:
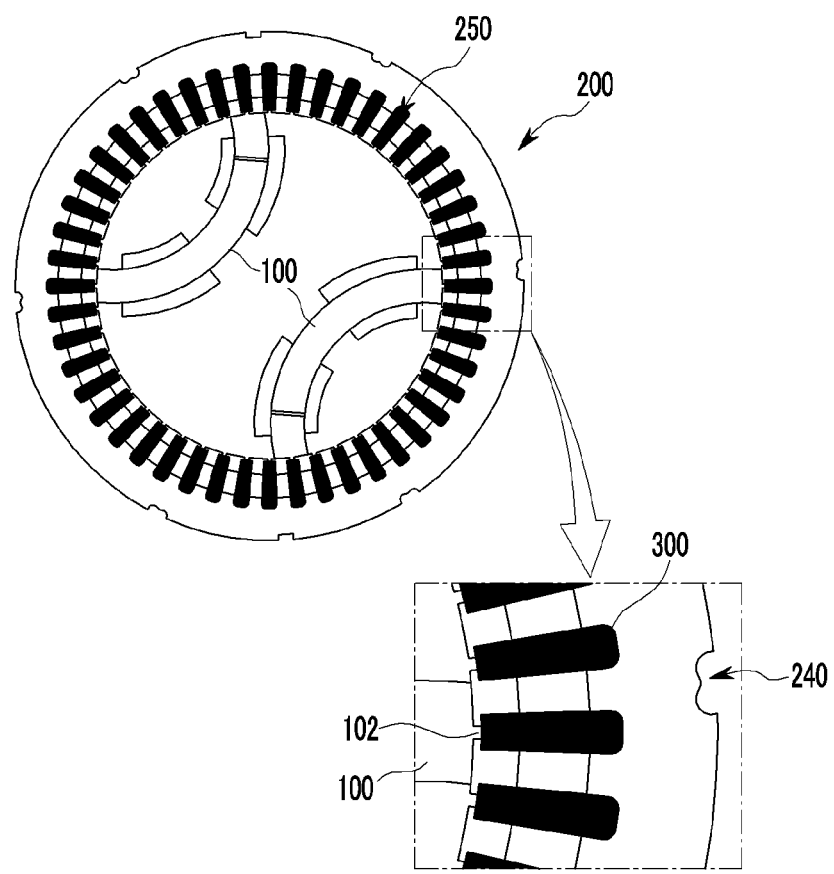
FIG. 9 is a plan view illustrating a state where a stator winding is wound around the C-shaped auxiliary core according to an exemplary embodiment of the present disclosure assembled with the stator core.

Referring to FIG. 9, a stator winding 250 may be inserted through the slots 230 of the stator core 200 to be wound around the stator teeth 220.

It is possible to accurately and quantitatively measure iron loss of the stator core 200 after a winding and varnishing process.

Figure 10:
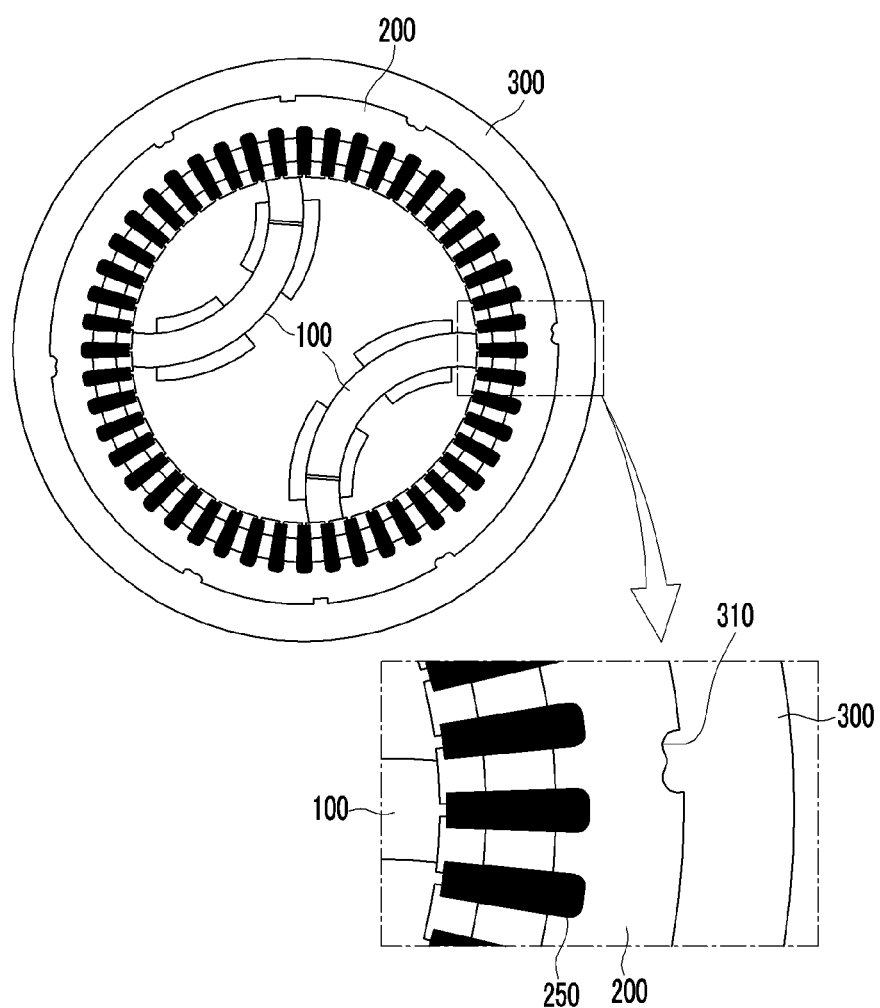
FIG. 10 is a top view illustrating a state where the C-shaped auxiliary core according to an exemplary embodiment of the present disclosure assembled with the stator core around which the stator winding is wound is inserted into a housing.

Referring to FIG. 10, the stator core 200 provided with the stator winding 250 may be inserted and fixed to a housing 300.

In this case, by inserting engagement projections 310 formed at an inner wall of the housing 300 into the fixing grooves 240 of the stator core 200 to be connected, it is possible to maintain a state where the stator core 200 and the housing 300 are stably assembled.

It is possible to accurately and quantitatively measure iron loss of the stator core 200 through the B-coil 120 after the stator core 200 is inserted into the housing.

Even though an external force, such as vibration, is applied to the C-shaped auxiliary core 100, according to the exemplary embodiment of the present disclosure, and connected to the stator teeth 220 of the stator core 200, because the end surfaces of the C-shaped auxiliary core 100 stably comes in contact with the end surface of the stator teeth 220, it is possible to accurately and quantitatively measure iron loss of the stator core 200 for each manufacturing process. As a result, the iron loss of the stator core 200 can be appropriately reduced, so that it is possible to effectively improve efficiency of the motor.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A structure for measuring iron loss of a motor stator core, comprising:
   an auxiliary core with two end surfaces in a longitudinal direction, wherein each end surface contacts an inner end surface of two adjacent stator teeth among a plurality of stator teeth in a radial direction in order to measure iron loss of a stator core in which a plurality of slots and the plurality of stator teeth are alternately formed on an inner circumferential surface of a stator yoke in a circumferential direction;
   a pair of excitation windings provided at portions of the auxiliary core in the longitudinal direction spaced-apart from each other;
   a B-coil that is a sensor coil provided at the auxiliary core so as to be positioned inside any one excitation winding of the pair of excitation windings; and
   fixing protrusions protruding from the both end surfaces of the auxiliary core to extend in the longitudinal direction, and inserted into the slot between the two adjacent stator teeth to be fitted and fixed in the circumferential direction.

2. The structure for measuring iron loss of the motor stator core of claim 1, wherein:
   a width of the stator yoke equals an entire width of the adjacent stator teeth.

3. The structure for measuring iron loss of the motor stator core of claim 1, wherein:
   the auxiliary core has a uniform width in the longitudinal direction.

4. The structure for measuring iron loss of the motor stator core of claim 1, wherein:
   a width of the auxiliary core is equal to or smaller than an entire width of the two adjacent stator teeth.

5. The structure for measuring iron loss of the motor stator core of claim 1, wherein:
   a width of the auxiliary core is equal to or greater than an entire width of the two adjacent stator teeth.

6. The structure for measuring iron loss of the motor stator core of claim 1, wherein:
   an inner end of the stator tooth in the radial direction is provided with projections at both edges in a width direction extending in the width direction.

7. The structure for measuring iron loss of the motor stator core of claim 6, wherein:
   one projection of the stator tooth protrudes toward one projection of another stator tooth adjacent thereto.

8. The structure for measuring iron loss of the motor stator core of claim 7, wherein:
   a width of the fixing protrusion is equal to a width between adjacent projections.

9. The structure for measuring iron loss of the motor stator core of claim 1, wherein:
   the fixing protrusion has a square shape.

10. The structure for measuring iron loss of the motor stator core of claim 1, wherein:
    the auxiliary core has a "C" shape.

* * * * *